US007134880B2

(12) United States Patent
Arai et al.

(10) Patent No.: US 7,134,880 B2
(45) Date of Patent: Nov. 14, 2006

(54) CONNECTOR WITH SELF-ADJUSTING VERTICAL ALIGNMENT FEATURE

(75) Inventors: Atsushi Arai, Tokyo (JP); Hideo Sugano, Tokyo (JP)

(73) Assignee: SMK Corporation, Tokyo (JP)

( * ) Notice: Subject to any disclaimer, the term of this patent is extended or adjusted under 35 U.S.C. 154(b) by 0 days.

(21) Appl. No.: 11/173,918

(22) Filed: Jun. 30, 2005

(65) Prior Publication Data

US 2006/0040519 A1 Feb. 23, 2006

(30) Foreign Application Priority Data

Aug. 18, 2004 (JP) ............................ 2004-238830

(51) Int. Cl.
*H01R 12/00* (2006.01)
*H05K 1/00* (2006.01)

(52) U.S. Cl. ...................................... 439/66; 439/733.1

(58) Field of Classification Search .................. 439/66, 439/71, 733.1, 862, 83
See application file for complete search history.

(56) References Cited

U.S. PATENT DOCUMENTS

| | | | | |
|---|---|---|---|---|
| 3,447,040 | A * | 5/1969 | Denton, Jr. | 361/808 |
| 3,551,750 | A * | 12/1970 | Sterling | 361/787 |
| 3,960,424 | A * | 6/1976 | Weisenburger | 439/66 |
| 4,655,519 | A * | 4/1987 | Evans et al. | 439/74 |
| 5,230,632 | A | 7/1993 | Baumberger et al. | |
| 5,380,210 | A * | 1/1995 | Grabbe et al. | 439/66 |
| 6,176,707 | B1 | 1/2001 | Neidich et al. | |
| 6,210,176 | B1 * | 4/2001 | Hsiao | 439/71 |
| 6,217,342 | B1 * | 4/2001 | Neidich et al. | 439/66 |
| 6,257,899 | B1 | 7/2001 | Walkup | |
| 6,290,507 | B1 * | 9/2001 | Neidich et al. | 439/66 |
| 2002/0182901 | A1 * | 12/2002 | Koopman et al. | 439/71 |
| 2004/0102062 | A1 * | 5/2004 | Liao et al. | 439/66 |
| 2004/0203264 | A1 * | 10/2004 | Liao et al. | 439/66 |
| 2004/0235316 | A1 * | 11/2004 | Liao et al. | 439/66 |
| 2005/0174746 | A1 | 8/2005 | Hsiao et al. | |

FOREIGN PATENT DOCUMENTS

| | | |
|---|---|---|
| DE | 10 2004 003385 | 8/2004 |
| JP | 2004-216868 | 7/2004 |
| JP | 2004-238830 | 8/2004 |

OTHER PUBLICATIONS

Patent Abstracts of Japan for JP03-226043 published Sep. 3, 1993.
European Search Report (foreign patent DE10 2004 003 385).

* cited by examiner

*Primary Examiner*—Tulsidas C. Patel
*Assistant Examiner*—Vladimir Imas
(74) *Attorney, Agent, or Firm*—Darby & Darby

(57) ABSTRACT

A connector has a plurality of holes formed in an insulating layer. Contacts inside these holes have contact parts at the top and bottom. Each contact has a base part, a pair of contact parts which extend up and down from the base part, a lip which is connected to the base part, and a latching part. Inside the holes of the insulation layer, there is a guide groove, which houses and retains the contact by the lip, and a stopper, which prevents the contact from slipping out by interfering with the latching part of the contact. The holes of the insulation layer house and retain the contacts while allowing for vertical movement of the contacts in the thickness direction of the insulation layer. The compression connection type connector can be aligned by a depositing device and also has a stable contact pressure.

6 Claims, 7 Drawing Sheets

CONNECTOR WITH SELF-ADJUSTING VERTICAL ALIGNMENT FEATURE

INCORPORATION BY REFERENCE

The present application claims priority under 35 U.S.C. §119 to Japanese Patent Application No. 2004-238830 filed on Aug. 18, 2004. The content of the application is incorporated herein by reference in its entirety.

FIELD OF THE INVENTION

The present invention generally relates to connectors. More specifically, the present invention relates to a connector in which, when connecting a LGA (land grid array) type electronic component to a printed board or when connecting printed boards with each other, interconnection of their electrodes is established by compressing and sandwiching the connector between these components.

BACKGROUND TO THE INVENTION

Examples of connectors of the prior art for connecting the electrode terminals of LGA electronic components, such as LSI (Large Scale Integration) or IC (Integrated Circuit) components, and printed boards and the like are shown in FIGS. 6A, 6B, 7A and 7B.

With the type shown in FIGS. 6A and 6B, a connector 110 is sandwiched between electronic components 101, 102 as shown in FIG. 6A as the electronic components 101, 102 are brought closer to each other. As shown in FIG. 6B, by having a plurality of electrodes 101*a*, 102*a* of both components push against and contact contact parts 132*a*, 132*b* of connector 110, the electronic components become electrically connected with each other via a contact 130 which is a conductor.

With connector 110, C-shaped contact 130 is a spring that is held in place by a protrusion 120*a* which is placed at the end of the spring. Contact parts 132*a*, 132*b* can be elastically deformed in the vertical direction.

However, because contact 130 is retained within hole 121 by protrusion 120*a*, as shown in FIG. 6B, when there is a connection, spring ends 132*c*, 132*d* interfere with protrusion 120*a*.

As a result, the repellent force of the spring is not always the same, and achieving a stable contact pressure for the contact parts becomes difficult.

In Japanese Laid-Open Patent Publication Number 5-226043, a contact body with a two-layer ohm-shaped construction is placed inside a housing. The contact body is retained between an upper and lower inner wall (chamber inner wall). However, with this construction, because there is variability in the spacing between the contact body and the upper and lower inner wall, there is variability in contact pressures between the plurality of contact points.

In addition, with the type shown in FIGS. 7A and 7B, FIG. 7B shows how a contact 140 is inserted into a hole 150. FIG. 7A shows a longitudinal cross-section in an area near the groove area when the contacts are attached. As shown in FIG. 7A, there is a lip 141 on contact 140. Lip 141 is pushed into groove 151 inside hole 150.

However, with this construction of affixing contact 140 by insertion and sandwiching of lip 141 in this way, the insertion position is not stable. The affixing position of the contact can be variable in the thickness direction of insulation 120. As a result, when there are a plurality of contact parts 142*a*, 142*b*, the contact pressure is not stable.

In addition, the shape of contact 140 is not vertically symmetrical due to the insertion orientation. Each of the plurality of contacts must have their orientation determined before insertion into hole 150. Productivity is extremely poor.

Upon considering the technical problems described above, the present invention provides a connector with a simple construction and which can achieve a stable connection pressure.

SUMMARY OF THE INVENTION

The present invention is a connector including a plurality of holes formed in an insulation layer and a contact having contact parts at the top and bottom and provided inside the hole. The contact has a base, a pair of contact parts which extend upward and downward from the base, a lip connected to the base, and a latching part. Inside the hole of the insulation layer, there is a guide groove, which houses and retains the contact by the lip. A stopper interferes with the latching part of the contact and prevents the contact from slipping out. The contact is housed and retained in a condition which allows for free vertical movement in the thickness direction of the insulation layer.

The connector is placed, compressed, and sandwiched between electronic components which are connected by stacking. For example, the connector is placed between LGA type LSI or IC and a printed board or between two printed boards. This type of connector includes, for example, LGA sockets.

When the connector is compressed and sandwiched between the electronic components, the opposing electrodes of the electronic components face the contact parts of the contact, which is a conductor, and compresses and deforms the contact parts to become interconnected.

A plurality of these contacts are formed. The contacts pass through the insulation layer in the thickness direction. The contacts are housed within holes (housing holes).

A stopper is provided on the hole inner wall. By latching with the latching part of the contact, the stopper prevents the contact from slipping out when the contact moves along the guide groove in the hole. As a result, the contact is retained inside the hole by the stopper and the guide groove. The contact is housed and retained while still allowing for vertical movement in the thickness direction of the insulation layer.

A bumper part is formed on the bottom of the guide groove, and the stopper is formed on the inner wall of the hole of the insulation on the opening side of the guide groove. With this construction, the contact either has the end of the lip bump that contacts the bumper part formed on the guide groove, or the latching part of the contact hits the stopper. Within this range, the contact can move freely.

In this manner, the contact is attached to the insulation layer while having a freedom of motion within a prescribed range. As a result, at the time of connection, the contact moves vertically, and the contact pressures from both sides of the connector to the electronic component electrodes are automatically adjusted so that they are the same.

In addition, because the contact pressure of the contact is automatically adjusted, the contact pressure of each of the plurality of connectors also becomes uniform.

When inserting the contact into the hole of the insulation layer, the latching part formed on the contact must pass over the stopper inside the hole. By forming on the stopper a sloping part along the insertion direction of the contact, the installation of the contact is improved.

In other words, the sloping part is formed sloped in the direction in which the opening area of the hole of the insulation layer becomes smaller from the outside inward.

By having a contact which is symmetrical in the vertical and left-right direction, there are no restrictions on the direction of insertion into the hole of the insulation layer. The installation of contacts into the insulation layer can be conducted in a batch by arranging a plurality of contacts onto a jig using a depositing apparatus or the like.

In the connector of the present invention, the contact is not affixed by insertion as in the connectors of the prior art, but the contact is retained by a guide groove part which houses and retains the lip and by a stopper which interferes with the latching part of the contact and prevents the contact from slipping out.

The contact can move freely in the thickness direction of the insulation layer. As a result, when connecting electronic components to each other, the contact pressure to the electronic component electrodes is stable and is made uniform by the movement of contacts. Also, as a result, the contact pressure between each of the contacts of the connector and the electronic component electrode is uniform, and a good connection is achieved.

In addition, the contact part does not get in the way of the hole inner wall and has a smooth elastic deformation. As a result, a stable spring pressure is achieved with a long stroke, and it can be used for insulations of varying dimensions.

In addition, the contact is symmetrical in the vertical and left-right direction. This is extremely good for productivity because the contacts can be housed in a case and arranged by a depositing apparatus and batch installation into the insulation is possible.

BRIEF DESCRIPTION OF THE FIGURES

The foregoing and other features of the present invention will be more readily apparent from the following detailed description and drawings of the illustrative embodiments of the invention wherein like reference numbers refer to similar elements and in which.

DESCRIPTION OF THE PREFERRED EMBODIMENTS

Figure 5A:
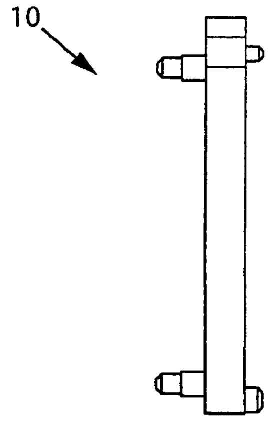
FIG. 5A is a side view of the connector of FIG. 1.
Figure 5B:
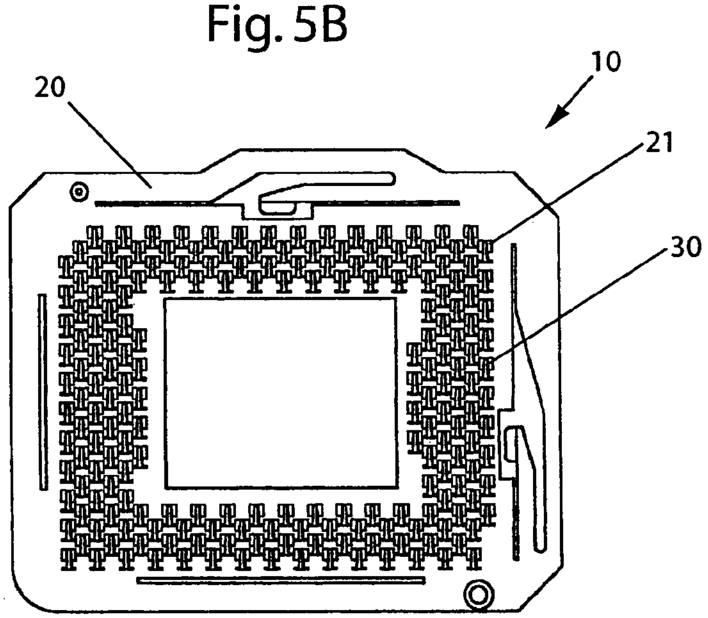
FIG. 5B is a top plan view of the connector of FIG. 1.
Figure 5C:
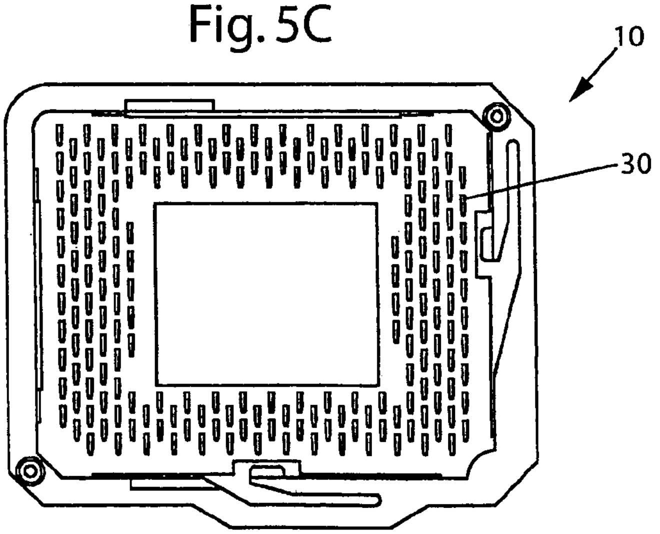
FIG. 5C is a bottom plan view of the connector of FIG. 1.
Figure 6A:
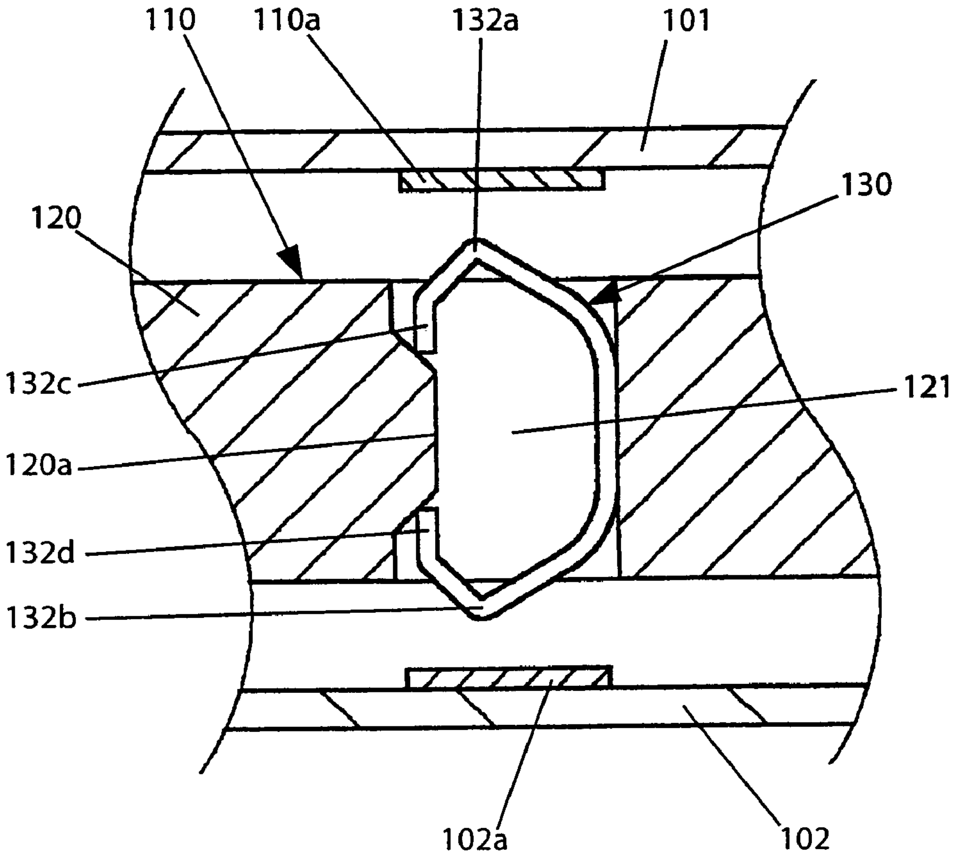
Fig. 6A Prior Art
FIG. 6A is an enlarged cross-sectional side view of a conventional connector showing the connection of electronic components using the connector.
Figure 6B:
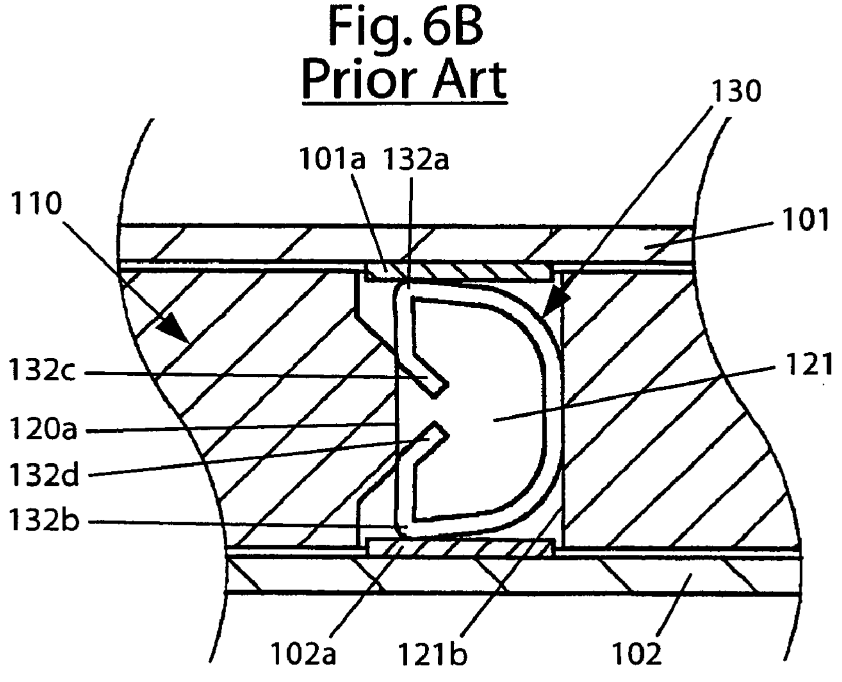
Fig. 6B Prior Art
FIG. 6B is an enlarged cross-sectional side view of the conventional connector of FIG. 6A after the electronic components have been connected.
Figure 7A:
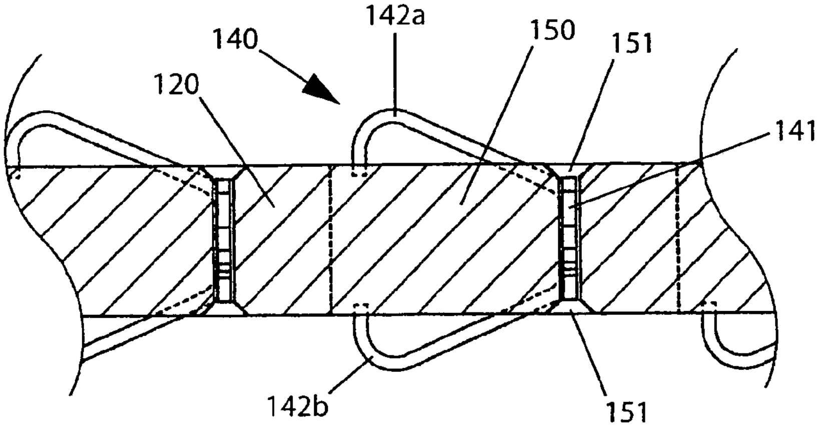
Fig. 7A Prior Art
FIG. 7A is an enlarged cross-sectional side view of another conventional connector.
Figure 7B:
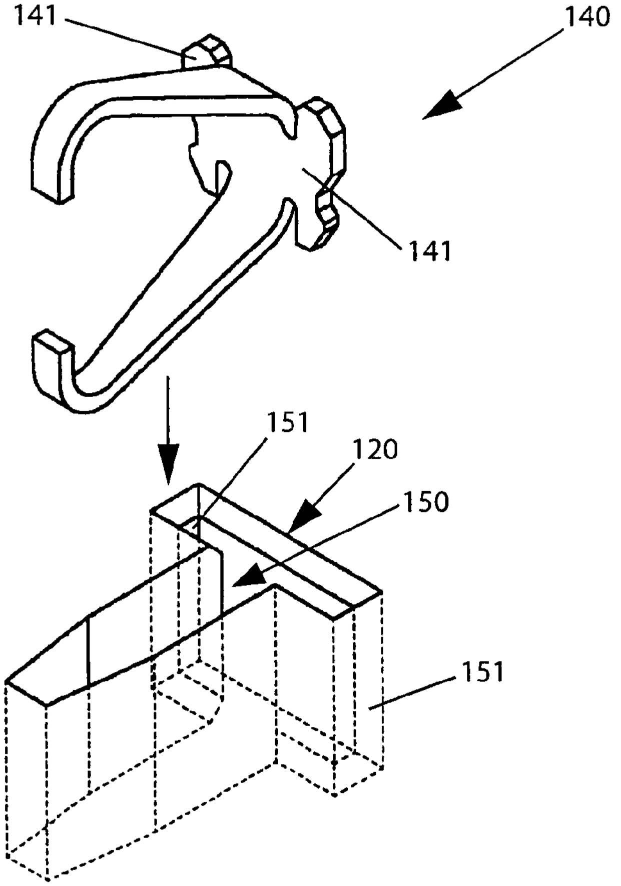
Fig. 7B Prior Art
FIG. 7B is an enlarged exploded perspective view of the conventional connector of FIG. 7A with a contact being inserted into a hole.

FIGS. 5A–5C show an embodiment of a connector 10 of the present invention. FIG. 5A shows a side view, FIG. 5B shows a top view, and FIG. 5C shows a bottom view. Connector 10 has a plurality of contacts 30 placed in the plane direction of an insulation layer 20. As a LGA socket, for example, connection with a printed board is made by having an LGA-type LSI attached on the side shown in FIG. 5C.

Figure 1A:
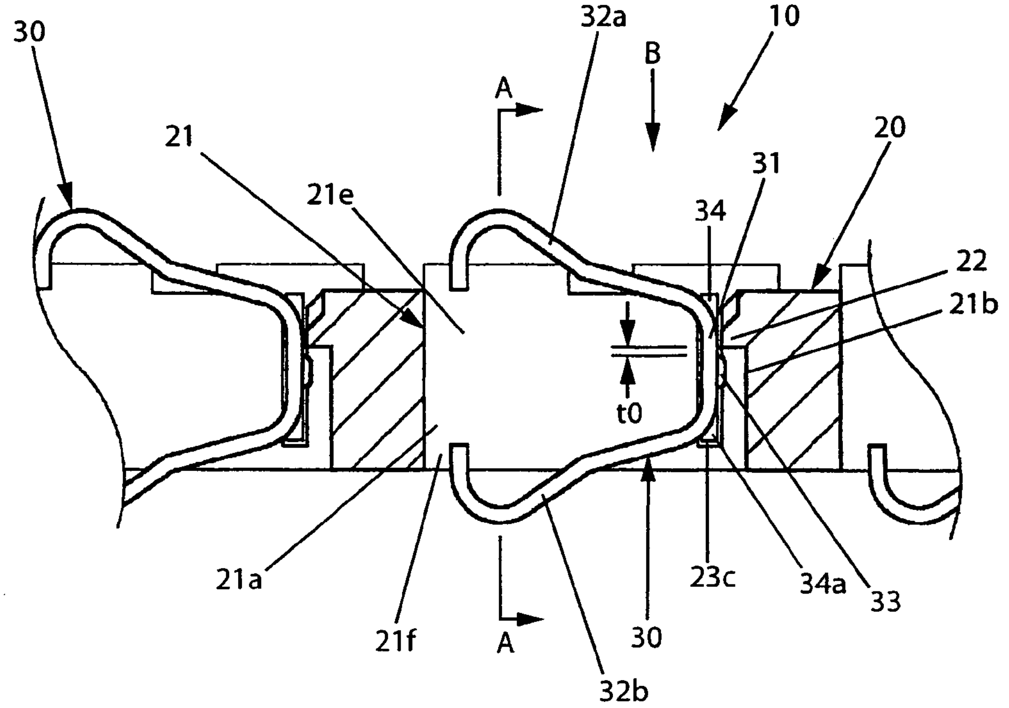
FIG. 1A is an enlarged cross-sectional side view of a contact of a connector according to an embodiment of the present invention.
Figure 1B:
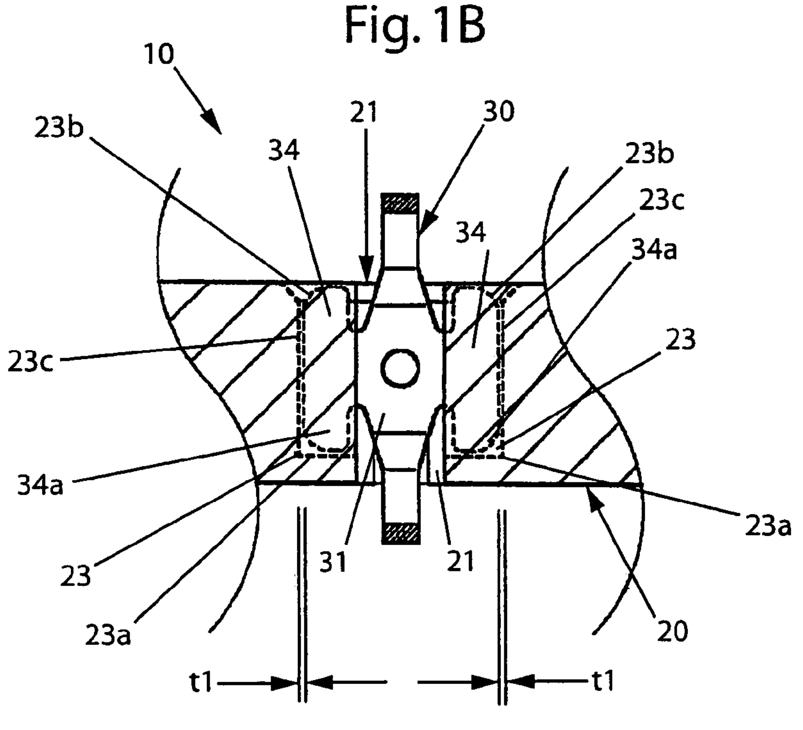
FIG. 1B is an enlarged cross-sectional view along line A—A of the contact of FIG. 1A.
Figure 1C:
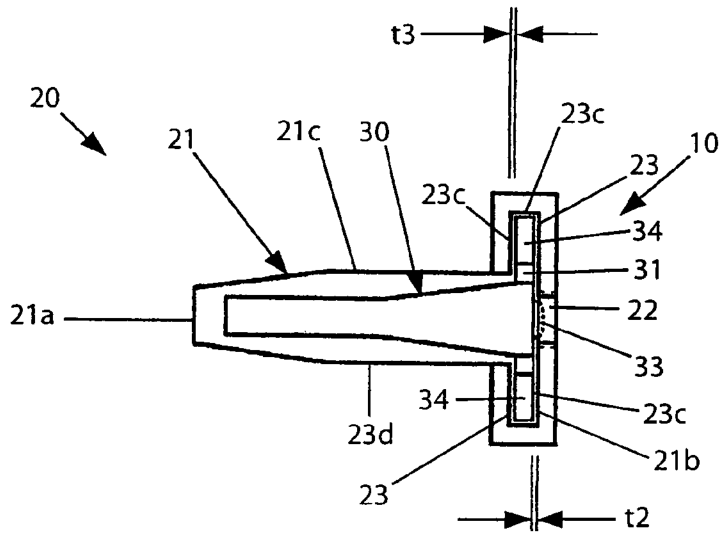
FIG. 1C is an enlarged top plan view of the contact as seen from arrow B of FIG. 1A.

FIG. 1A is a longitudinal cross-sectional view in which the area near contact 30 of connector 10 is enlarged. FIG. 1B is a cross-sectional view taken along line A—A. FIG. 1C shows the principal elements as seen from the view in the direction of arrow B.

Referring to FIG. 1C, with contact 30, a planar base 31 is placed along a wall 21*b* of T-shaped hole 21 and is placed perpendicular to the plane of the insulation layer. A pair of lips 34 extend from both sides of base 31. In addition, contact parts 32*a*, 32*b* are connected on both sides of base 31 in the thickness direction of insulation layer 20. Contact parts 32*a*, 32*b* extend outward from hole 21. Contact parts 32*a*, 32*b* extend to a wall 21*a* which is opposite base 31. In addition, base 31 has a latching part 33 which protrudes towards wall 21*b* which is on a base side of hole 21.

Figure 2:
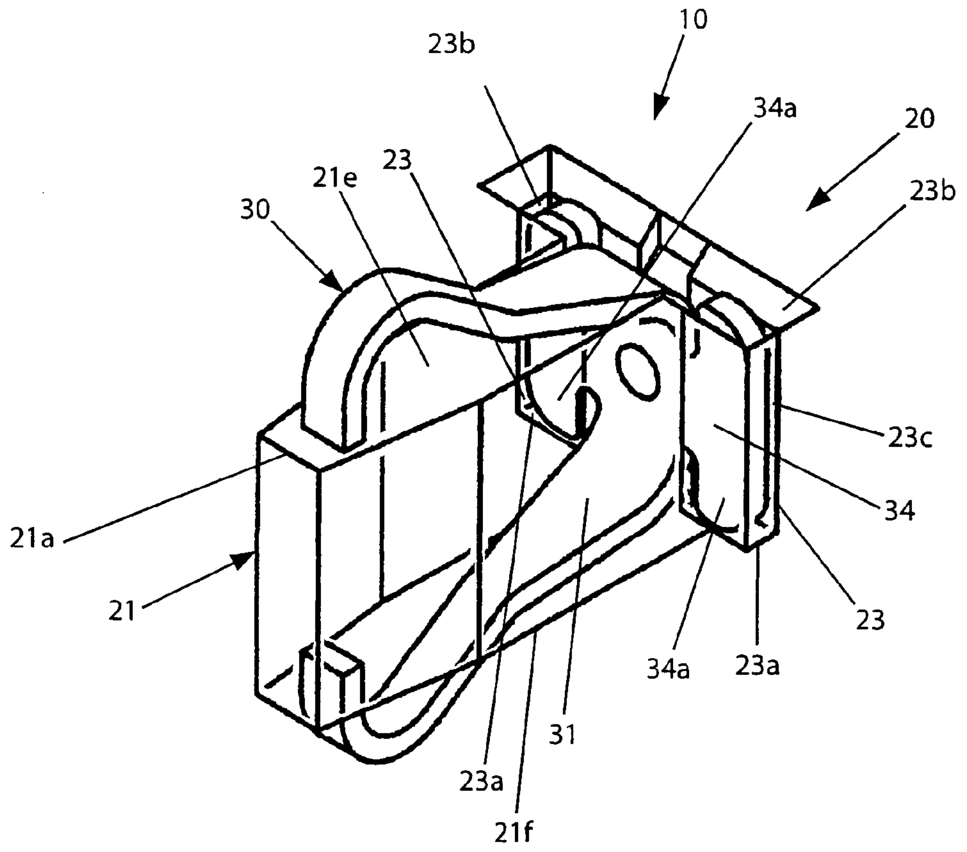
FIG. 2 is an enlarged perspective view of the contact of FIGS. 1A–1C.

Connector 10 is provided with a hole 21 which passes through insulation layer 20, which has a flat plane shape, in the thickness direction. Contact 30 is provided within hole 21. FIG. 2 is a perspective view of the principal elements in which hole 21 and contact 30 are seen through insulation layer 20. On wall surface 21*b* on the base side of hole 21, hole 21 is provided with a protruding stopper 22, which, by interfering with latching part 33, restricts the movement of latching part 33 and prevents contact 30 from slipping out.

Between stopper 22 and latching part 33, there is a spacing t0 of a prescribed distance. With this construction, contact 30 is restricted but also has some freedom of movement within the prescribed range t0 towards opening 21*e* of hole 21.

Walls 21*c*, 21*d* of hole 21 shown in FIG. 1C are provided opposite a guide groove 23. Guide groove 23 is a groove in the thickness direction of insulation layer 20. Guide groove 23 has an opening 23*b* on one side, and on the other side, there is a bumper part 23*a* which comes in contact with lip end 34*a*. As shown in FIG. 1B and FIG. 2, lip 34 is inserted into guide groove 23. Between lip 34 and the walls which construct guide groove 23, there are spacings indicated by the widths t1, t2, t3.

The movement range for contact 30 in the thickness direction of insulation layer 20 is within a range in which at one end of contact 30, lip end 34*a* bumps into bumper part 23*a* and toward the other end of contact 30, latching part 33 is stopped by stopper 22. Contact 30 is able to move smoothly by having spacings of widths t1, t2, t3 between contact 30 and the walls of guide groove 23.

Figure 3A:
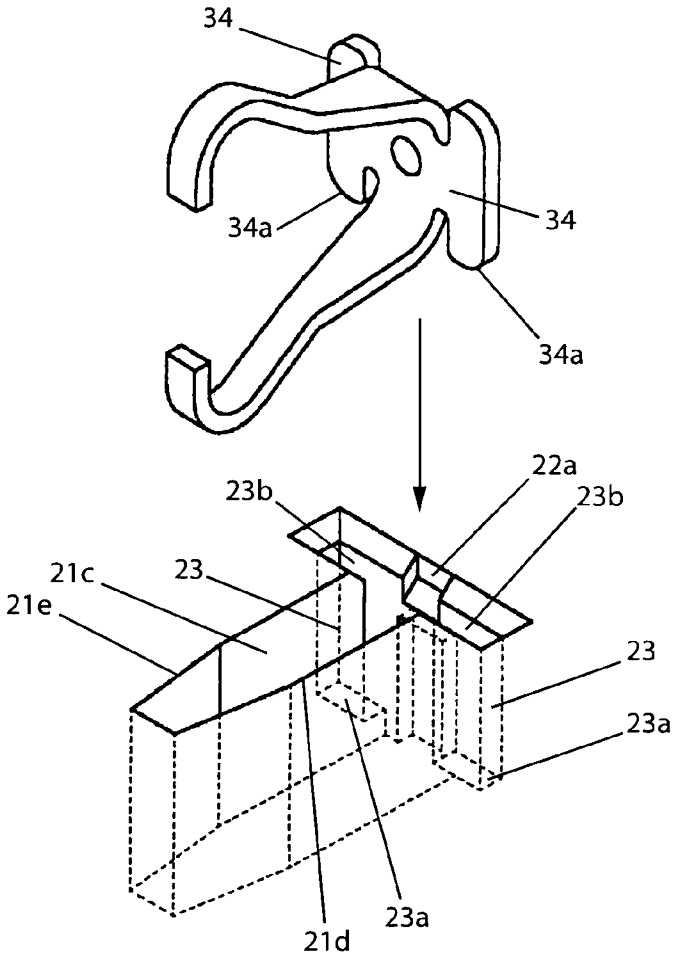
FIG. 3A is an enlarged exploded perspective view of the connector of FIGS. 1A–1C with the contact being inserted into a hole.
Figure 3B:
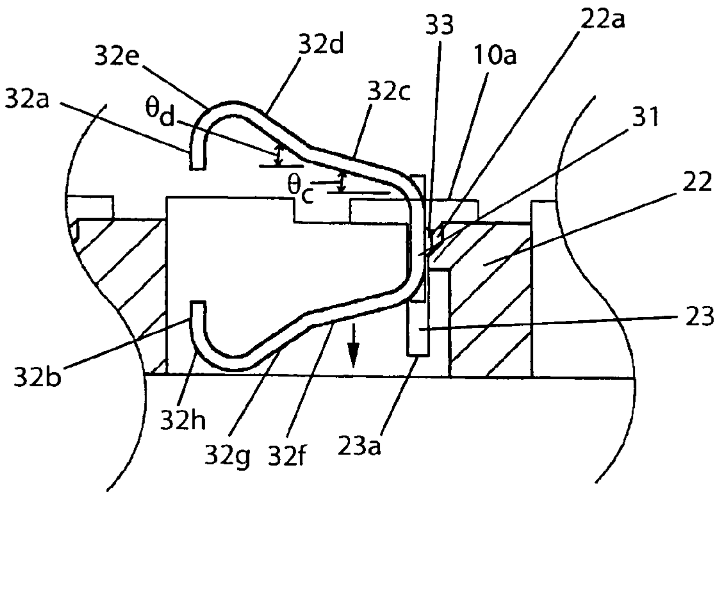
FIG. 3B is an enlarged cross-sectional side view of the connector of FIG. 3A with the contact inserted into the hole.

The installation of the contact into the hole will be described. FIGS. 3A and 3B show contact 30 being installed in hole 21.

As shown in FIG. 3A, in order to house contact 30 inside hole 21, lip 34 is inserted into guide groove 23 from opening 21*e*. Thereupon, as shown in the longitudinal cross-section of FIG. 3B, there is an interference of latching part 33 by stopper 22, but contact 30 is pushed in further. In this situation, because stopper 22 has a sloping part 22*a* along the insertion direction of the contact, latching part 33 or stopper 22 elastically deforms along this sloping part 22*a*, and latching part 33 can pass over stopper 22.

Lip end 34*a* shown in FIGS. 1A–1C and 2 bumps into bumper part 23*a* of guide groove 23, and there is a snap latch of latching part 23 by stopper 22. In this manner, with regard to the position of contact 30 in the insulation thickness direction, contact 30 can freely move between a position at which movement is restricted by latching part 33 and stopper 22 to a position where lip end 34*a* is restricted by bumper part 23*a* of guide groove 23. The positioning of contact 30 in the plane orientation of insulation layer 20 is conducted by insertion of lip 34 into guide groove 23.

Contact 30 is symmetrical in the vertical direction of FIG. 1A, which is the thickness direction of insulation 20, and in the right-left direction in the direction of the plane of insulation layer 20 in FIG. 1B. As a result, when installing contacts 30 into insulation layer 20, contacts 30 are housed loosely in a case, and this is arrayed onto a jig by a depositing apparatus (not shown). The insulation is then placed on the jig, and a batch assembly is conducted by an assembly device. This installation and assembly has good production value.

Contact parts 32*a*, 32*b* are further described with reference to FIG. 3*b*. Contact part 32*a* includes a first linear portion 32*c*, a second linear portion 32*d* and a rounded portion 32*e*. As shown in FIG. 3*b*, the first linear portion 32*c* of contact part 32*a* extends in a upward direction from base 31 toward a distal end of the first linear portion 32*c* and at an angle $\theta_c$ as referenced from an upper surface 10*a* of the connector 10. The second linear portion 32*d* extends in an upward direction from the distal end of the first linear portion 32*c* toward a distal end of the second linear portion 32*d* and at an angle $\theta_d$ as referenced from the upper surface 10*a*. The angle $\theta_d$ is increased over the angle $\theta_c$. The rounded portion 32*e* extends from the distal end of second linear portion 32*d*. Contact part 32*b* is symmetrical to contact part 32*a*, having a rounded portion 32*h* and linear portions 32*f*, 32*g* that extend in a downward direction.

Figure 4A:
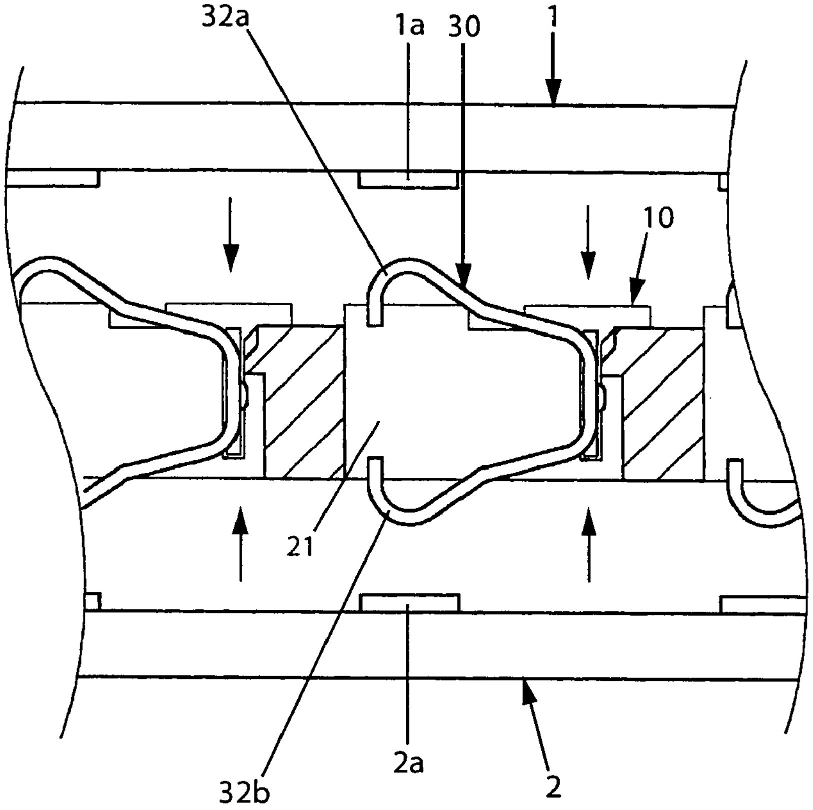
FIG. 4A is an enlarged cross-sectional side view of the connector of FIGS. 1A–1C prior to forming a connection of electronic components using the connector.
Figure 4B:
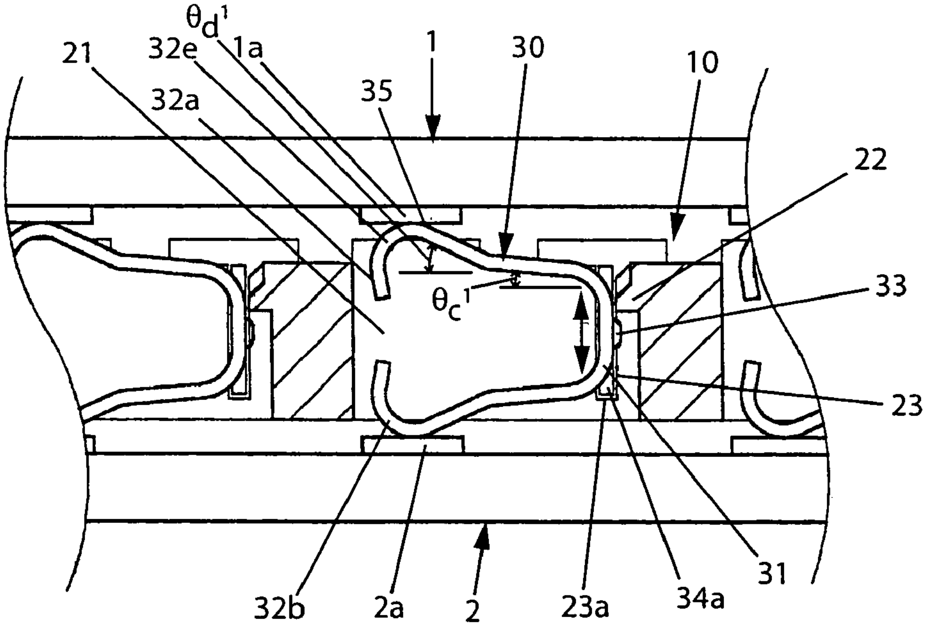
FIG. 4B is an enlarged cross-sectional side view of the connector of FIG. 4A when the electronic components are connected.

Next, the connection of electronic components to each other using the connector of the present invention is described. FIG. 4A shows a longitudinal cross-sectional view of connector 10 prior to forming a connection. FIG. 4B shows a longitudinal cross-sectional view of connector 10 during connection.

As shown in FIG. 4A, connector 10 is placed between a LSI 1 and a printed board 2 which are connected by stacking. As shown in FIG. 4B, connector 10 is compressed and sandwiched between LSI 1 and printed board 2. With this construction, lands (electrodes) 1*a*, 2*a* at opposing positions compress contact parts 32*a*, 32*b* of connector 10 from both sides and elastically deform contact parts 32*a*, 32*b*. Lands 1*a*, 2*a* are electrically connected with each other through contact 30.

At the same time, because contact 30 is guided by guide groove 23 to move vertically within a prescribed range between stopper 22 and guide groove bumper part 23*a*, contact 30 moves and stabilizes so that the contact pressure between land 1*a* of LSI 1 and contact part 32*a* and the contact pressure between land 2*a* of printed board 2 and contact part 32*b* are equal.

When contact parts 32*a*, 32*b* elastically deform within the range of the bending stroke, they contact electrodes 1*a*, 2*a* with a stable contact pressure without interfering with the walls of hole 21. As a result, each of the plurality of contacts 30 provided on connector 10 shown in FIG. 5 has a uniformly good connection.

With reference to FIGS. 3*b*, 4*a* and 4*b*, when connector 10 is compressed and sandwiched between LSI 1 and printed board 2, contact part 32*a* is elastically deformed such that a deformed first portion angle $\theta_{c'}$ is reduced over the angle $\theta_c$, and a deformed second portion angle $\theta_{d'}$ is reduced over the angle $\theta_d$. As LSI 1 and printed board 2 are compressed against the connector 10, rounded portion 32*e* maintains a contact point 35 with contact pad 1*a*, and moves slidably along a path (not shown) in a direction away from base 31. The movement of contact point 35 along this path is effective to cause a mechanically wiping and cleansing of contact pad 1*a* and rounded portion 32*e* along the path defined by the movement of contact point 35.

What is claimed is:

1. A connector comprising:

a plurality of holes formed in an insulation layer; and a contact provided inside one of said plurality of holes, said contact comprising;

a base, upper and lower contact parts extending respectively in an upward and a downward direction from said base, lips connected to each of a left edge and a right edge of said base, and a latching part disposed on said base;

a guide groove inside said hole of said insulation layer, said guide groove housing and retaining said contact by said lips; and a stopper interfering with said latching part and preventing said contact from slipping out, said stopper being disposed inside said hole of said insulation layer and including a sloping part along an insertion direction of said contact;

wherein said contact is housed and retained in a condition which allows for vertical movement in a thickness direction of said insulation layer, and wherein said contact is symmetrical in each of an up-down direction and a right-left direction with reference to a midpoint of said base.

2. A connector as described in claim 1, wherein said contact is movable within a range in which an end part of each of said lips contacts a bumper part formed on said guide groove.

3. A connector as described in claim 1, wherein said contact is movable within a range in which said latching part of said contact hits said stopper.

4. A connector as described in claim 1, wherein said contact is movable within a range in which an end part of each of said lips contacts a bumper part formed on said guide groove.

5. A connector as described in claim 1, wherein said contact is movable within a range in which said latching part of said contact hits said stopper.

6. A connector comprising:

a plurality of holes formed in an insulation layer; and a contact provided inside one of said plurality of holes, said contact comprising;

a base, at least one contact part extending in at least one of an upward and a downward direction from said base, wherein said at least one contact part includes a first linear portion, a second linear portion and a rounded portion, the first linear portion extending from said base toward a distal end of the first linear portion at a first angle $\theta_c$ as referenced from a surface of the connector, the second linear portion extending from the distal end of the first linear portion toward a distal end of the second linear portion at a second angle $\theta_d$ as referenced from the connector surface, and the rounded portion extending from the distal end of the second linear portion 32*d*, wherein the second angle $\theta_d$ is larger than the first angle $\theta_c$, a lip connected to said base, and a latching part disposed on said base;

a guide groove inside said hole of said insulation layer, said guide groove housing and retaining said contact by said lip; and a stopper interfering with said latching part and preventing said contact from slipping out, said stopper being disposed inside said hole of said insulation layer and including a sloping part along an insertion direction of said contact;

wherein said contact is housed and retained in a condition which allows for vertical movement in a thickness direction of said insulation layer.

* * * * *